United States Patent
Abramovici et al.

(10) Patent No.: US 7,650,545 B1
(45) Date of Patent: Jan. 19, 2010

(54) PROGRAMMABLE INTERCONNECT FOR RECONFIGURABLE SYSTEM-ON-CHIP

(75) Inventors: Miron Abramovici, Berkeley Heights, NJ (US); Yuzheng Ding, Berkeley Heights, NJ (US); Barry K. Britton, Orefield, PA (US); Harold N. Scholz, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 1391 days.

(21) Appl. No.: 10/379,043

(22) Filed: Mar. 4, 2003

Related U.S. Application Data

(60) Provisional application No. 60/414,742, filed on Sep. 30, 2002.

(51) Int. Cl.
*G01R 31/28* (2006.01)
(52) U.S. Cl. .................. 714/726; 714/727; 326/38
(58) Field of Classification Search ............ 326/38–41, 326/47; 714/724–727
See application file for complete search history.

(56) References Cited

U.S. PATENT DOCUMENTS

| | | | |
|---|---|---|---|
| 5,706,296 A * | 1/1998 | Whetsel ................... 714/726 |
| 5,889,788 A * | 3/1999 | Pressly et al. ............ 714/726 |
| 5,909,126 A * | 6/1999 | Cliff et al. ................ 326/41 |
| 5,954,824 A * | 9/1999 | Cherichetti et al. ...... 714/28 |
| 6,268,743 B1 * | 7/2001 | Kaptanoglu ............... 326/40 |
| 6,314,539 B1 * | 11/2001 | Jacobson et al. ......... 714/727 |
| 6,446,230 B1 * | 9/2002 | Chung ...................... 714/726 |

OTHER PUBLICATIONS

Sandeep Koranne, "A Novel Reconfigurable Wrapper for Testing of Embedded Core-Based SOCs and its Associated Scheduling Algorithm", Aug. 28, 2001, Kluwer Academic Publisher, p. 1-8.*

* cited by examiner

*Primary Examiner*—Vibol Tan
*Assistant Examiner*—Christopher Lo
(74) *Attorney, Agent, or Firm*—Mendelsohn, Drucker & Associates, P.C.; Yuri Gruzdkov; Steve Mendelsohn

(57) ABSTRACT

Signals sent from one system-on-chip core become switched to a reconfigurable logic core (RLC) for observation and, perhaps, replacement with another signal. A first signal line couples together a plurality of cores. A switch, disposed between the first signal line and an input signal line of the RLC, selectively controls whether the signal gets sent to the RLC. A multiplexer, having the first signal line and an output signal line of the RLC as inputs, selectively controls whether the signal or a replacement signal becomes conveyed to another core of the system-on-chip. Observation and control configuration memory bits act as inputs in the selective control of the switch and the multiplexer. Other embodiments teach shared RLC input signal lines amongst multiple cores. The RLC may contain an inverter, a test circuit, a logic analyzer or other. Methods of observing and replacing signals are also taught.

14 Claims, 4 Drawing Sheets

PROGRAMMABLE INTERCONNECT FOR RECONFIGURABLE SYSTEM-ON-CHIP

This application claims the benefit of U.S. Provisional Application No. 60/414,742, filed Sep. 30, 2002.

TECHNICAL FIELD

The present invention relates generally to the field of reconfigurable systems-on-chip and, more particularly, to a programmable interconnect between cores of the system-on-chip.

BACKGROUND OF THE INVENTION

Motivated by inflexible specific hardware components and the increasing costs of reworking application specific integrated circuits (ASIC's), those skilled in the art have begun combining known reconfigurable devices, such as field programmable gate arrays (FPGA's), with ASIC's to exploit the benefits of both architectures and achieve systems-on-chip having an enhanced measure of flexibility and efficiency.

One such approach in this area, such as the field programmable system chip (FPSC), integrates ASIC cores into an FPGA structure while another approach embeds an FPGA or a reconfigurable logic core (RLC) as another of the proprietary cores in a system-on-chip. Both approaches, however, fail in one aspect or another. The FPSC approach fails because the FPSC dominates the chip physically thereby requiring a relatively large silicon spatial area of the system-on-chip and high power at the expense of the ASIC and its associated cores. The RLC approach fails because only a subset of the system-on-chip signals ever reach the RLC and the ones that do may not allow for the fixing of errors or the upgrading of associated hardware, for example.

Accordingly, the system-on-chip arts desire a cost-effective solution for the foregoing problems that consume little system-on-chip area and power while providing troubleshooting and hardware-upgrading flexibility.

SUMMARY OF THE INVENTION

The above-mentioned and other problems become solved by applying the apparatus, method and system principles and teachings associated with the hereinafter described programmable interconnect for a reconfigurable system-on-chip.

According to one aspect of the invention, signals sent from one system-on-chip core become switched to a reconfigurable logic core (RLC) for observation and, perhaps, replacement with another signal. In so doing, the RLC can monitor each signal and provide user flexibility, testing, troubleshooting, upgrading, etc.

In one embodiment, a first signal line couples together a plurality of cores of the system-on-chip. A switch, electrically disposed between the first signal line and an input signal line of the RLC, selectively controls whether the signal gets sent to the RLC.

A multiplexer, having the first signal line and an output signal line of the RLC as inputs, selectively controls whether the original signal or a replacement signal becomes conveyed back to the original core or to another core of the system-on-chip.

An observation and control configuration memory bit act as inputs in the selective control of the switch and the multiplexer, respectively. In preferred embodiments, a logic one for the configuration memory bits turns the switch on and allows the RLC to control an output of the multiplexer.

In other embodiments, the RLC shares its input signal line amongst a plurality of cores. In various specific embodiments, the RLC contains an inverter, a test circuit, a logic gate and a logic analyzer. Depending upon need, a programmer controls the inputs of such devices by simple modification to a configuration random access memory (RAM) located in the RLC.

This invention also teaches methods for observing and replacing a signal in a reconfigurable system-on-chip. In observing a signal, a first core provides the signal on a first signal line thereof. A transistor, selectively controlled by an observation configuration memory bit, switches the signal to an input signal line of the RLC where it can be observed. In replacing the signal, the RLC first provides the signal for observation and then replaces it with a replacement signal. The RLC then conveys the replacement signal to another core of the system-on-chip via a multiplexer. A control configuration memory bit selectively controls the multiplexer operation.

In still another embodiment, the invention teaches a method of observing and determining whether a signal is to be conveyed from one core of a reconfigurable system-on-chip to another.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The accompanying drawings incorporated in and forming a part of the specification, illustrate several aspects of the present invention and together with the description serve to explain the principles of the invention. In the drawings.

Reference will now be made in detail to the present preferred embodiment of the invention, an example of which is illustrated in the accompanying drawings.

DETAILED DESCRIPTION OF THE INVENTION

In a typical reconfigurable system-on-chip, a core represents a proprietary design of the system-on-chip manufacturer that end users, and programmers of the reconfigurable device, do not normally have knowledge about. However, to enable the end user or programmer to interact with the proprietary cores, the manufacturers provide a set of software programs, routines, codes, instructions, rules, etc.

In general, the system-on-chip has hard and/or soft cores. A hard core contains a chip design layout while a soft core contains a specific circuit, for example. This invention contemplates either or both types of cores or other general or specific core defined by a manufacturer and does not require any specific embodiment thereof. Cores may additionally include, in whole or part, specific apparatuses, such as a digital signal processor, an mpeg controller, a memory block or other.

Figure 1:
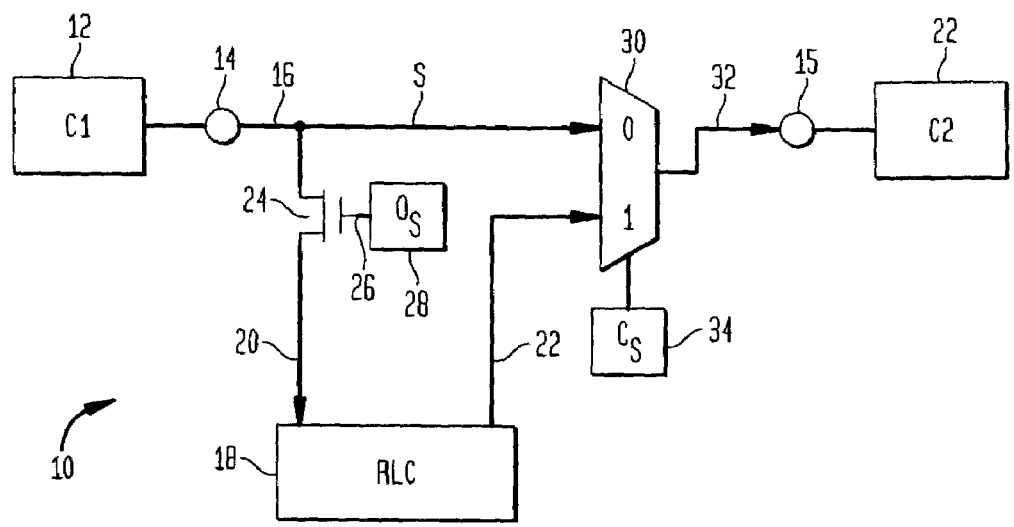
FIG. 1 is a diagrammatic view in accordance with the present invention of a reconfigurable system-on-chip.

With reference to FIG. 1, the invention shows a reconfigurable system-on-chip generally as 10. The system-on-chip 10 contains a plurality of cores 12 labeled C1 or C2 to facilitate a discussion regarding signals, S, being sent from one core to another. A signal node emanates diagrammatically from each of the cores 12 for either sending (node 14) or receiving (node 15) such signals. A first signal line 16 emanates from the signal node 14 of core C1 for conveying a signal, S, to another core, such as core C2, during programming or troubleshooting of the system-on-chip 10, for example. This signal line, as all others described herein, may include any of a variety of conductors or semiconductors well known in the art useful in the conveyance of electrical signals. The signals, S, described herein may include any signals known in the art, such as discrete logic levels, a logic 1 or 0, any information bearing signal, digital, analog, audio, video, or other.

The system-on-chip further contains a reconfigurable logic core (RLC) 18 having an input signal line 20 and an output signal line 22. In one embodiment, the RLC comprises an embedded field programmable gate array (FPGA) and, in another, may or may not include whole or part of a user-defined set of logic.

Electrically disposed between the first signal line 16 and the input signal line of the RLC 18 is a switch 24 for switching signals from the first signal line 16 to the input signal line 20. As shown, the switch comprises a field effect transistor. Those skilled in the art, however, will appreciate that the switch 24 may include any variety of transistor or other hardware or software component, discrete or otherwise, that performs a signal switching function.

At an input 26 of the switch 24 (in this embodiment, a gate 26) resides an observation, Os, configuration memory bit 28 for selectively controlling the on and off operation of the switch depending upon whether Os becomes set as a logic 1 or 0. As shown, the switch 24 turns on when Os is a logic 1 and turns off when Os is a logic 0. When turned on, the signal, S, on the first signal line 16 switches to the input signal line 20 of the RLC 18. When turned off, the signal, S, does not switch and remains on the first signal line 16 where it exists as one of the inputs to a multiplexer 30.

As a result of signals switching to the RLC, an end user or programmer has a simple and convenient access by which they can observe each and every signal, S, sent from a core which, heretofore, has not been possible.

Observation of the signal then allows a user, for example, to ascertain whether they desire to use the signal "as is" and convey it to another of the cores, to change or modify the signal, to monitor it for assistance in troubleshooting, or other. In the event the user desires to forego using the observed signal "as is," they can replace it with a replacement signal from the RLC having appropriate attributes.

Such replacement of the signal occurs as a function of the multiplexer 30 and its associated control configuration memory bit 34. In particular, the output signal line 22 of the RLC 18 electrically connects the RLC to the multiplexer 30 and provides a signal input thereto. As before, the other input to the multiplexer 30 includes the first signal line 16.

The control, Cs, configuration memory bit 34 selectively controls the operation of the multiplexer and causes either the signal on the first signal line 16 or a replacement signal, for example, on the output signal line 22 to become conveyed to the other core C2 on a signal line output 32. A logic state of the control configuration memory bit dictates which signal gets conveyed. In a preferred embodiment, a logic 1 conveys the replacement signal on the output signal line 22 while a logic 0 conveys the original signal, S, on the first signal line 16. Those skilled in the art, however, will appreciate that the multiplexer can convey either signal upon either logic state depending upon how the multiplexer gets configured. Although not shown, the multiplexer may additionally include other signal lines from other devices, such as another core, as inputs.

Upon initial power up, both configuration memory bits 28, 34 begin as a logic 0. They become active controllers with logic 1 states from a configuration memory (not shown) that a programmer configures or "loads" with a device off of the silicon chip that contains the system-on-chip 10. In one embodiment, a processor or other hardware mechanism loads the configuration memory in a manner similar to configuring a conventional FPGA. The loading further includes setting the multiplexer, for example, as active as a logic 1 or 0. Other circuitry (not shown), such as signal lines, preferably connect to both the observation and control configuration memory bits from the larger configuration memory.

Those skilled in the art should now appreciate that since a user can observe each and every signal from a core and can decide whether to convey the signals or replacement signals to another core that they no longer have to rework fixed ASIC designs, for example, when they realize that the original core signals are not desirable. As such, this invention creates a solution, realized by switching and multiplexing, that represents a considerable cost benefit when compared to reworking an ASIC.

Figure 2:
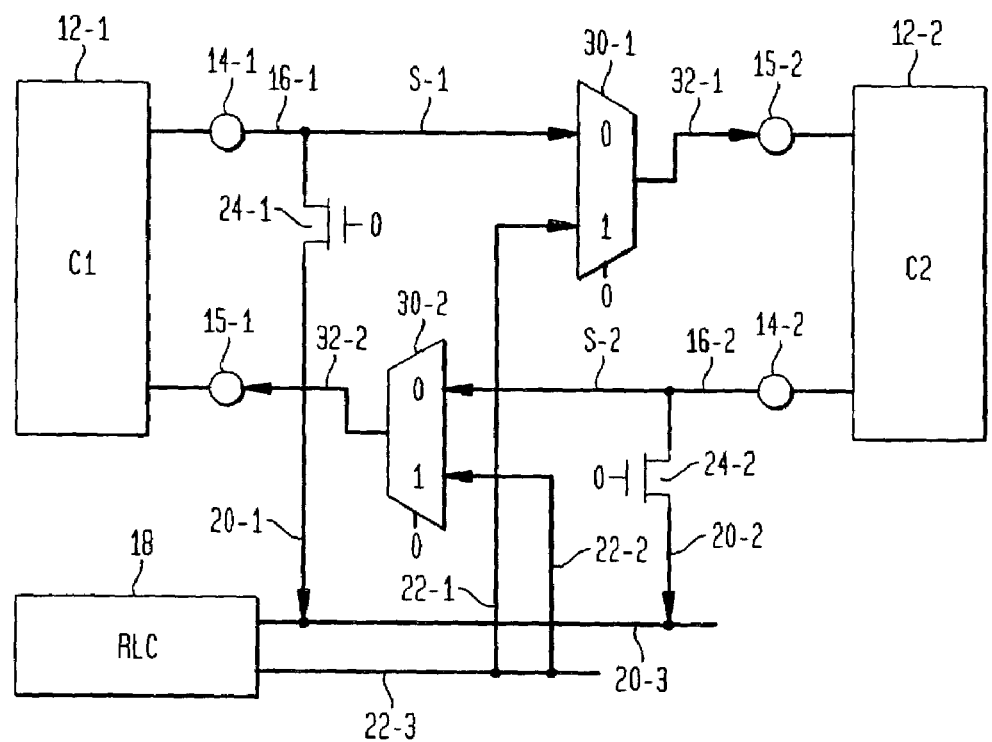
FIG. 2 is a diagrammatic view in accordance with the present invention of a reconfigurable system-on-chip with a reconfigurable logic core having a shared input signal line.

With reference to FIG. 2, in the event each of the pluralities of cores 12 have signals to be conveyed to other cores, this invention contemplates a shared input signal line 20-3 (a bus, for example) of the RLC to share signals input to the RLC from a plurality of input signal lines 20-1, 20-2. In this way, each signal from every core can be observed and replaced, if necessary, with a more appropriate signal. Such design, as will become more apparent below, will lend itself more robustly to troubleshooting techniques, signal inversion, signal analysis, and other.

In a manner similar to the input signal line, the design implements the output signal line 22-3 of the RLC 18 to share an output of the RLC amongst a plurality of output signal lines 22-1, 22-2 which, in turn, provide input to respective multiplexers 30-1, 30-2.

To accommodate the pluralities of signals from different cores, the system-on-chip further comprises pluralities of switches 24-1, 24-2 for selectively switching signals received on first signal lines 16-1, 16-2, that electrically originate from cores 12-1, 12-2, to the input signal lines 20-1, 20-2. As shown, all the observation and control configuration memory bits comprise logic 0's. Thus, none of the switches 24-1, 24-2 are turned on and, therefore, no signals on the first signal lines 16-1, 16-2 get switched to the shared input signal line 20. Likewise, since all control configuration memory bits comprise logic 0's, the multiplexers 30-1, 30-2 convey the original signals S-1, S-2, on their respective first signal lines 16-1, 16-2 from their respective cores 12-1, 12-2 to the other of the cores 12-2, 12-1 on signal line outputs 32-1, 32-2 of the multiplexers.

In the event, however, inputs to the switches 24 comprised logic 1's the signals S-1, S-2 would switch from the first signal lines to the input signal lines of the RLC for observation. Logic 1's as control configuration memory bits of the multiplexers would convey signals, such as a replacement signal, on the output signal lines 22 to the proper cores. Thus, the particular implementation of signal switching, observation, replacement, etc. is a function of the actual observation or control configuration memory bit value.

While FIG. 2 shows only two cores 12 (C1, C2), those skilled in the art should appreciate that still additional cores can connect to the RLC 18 along its shared input signal line 20-3. In one embodiment, the pluralities of cores number from the two shown up to ten. The system-on-chip typically contains four to ten cores. This invention, however, dictates no specific number and embraces all numeric embodiments.

With regard to the remaining figures, the RLC 18 contains a specific device, such as an inverter, a test circuit or a logic gate that this invention will use to teach a specific signal replacement, troubleshooting or signal monitoring technique.

Figure 3:
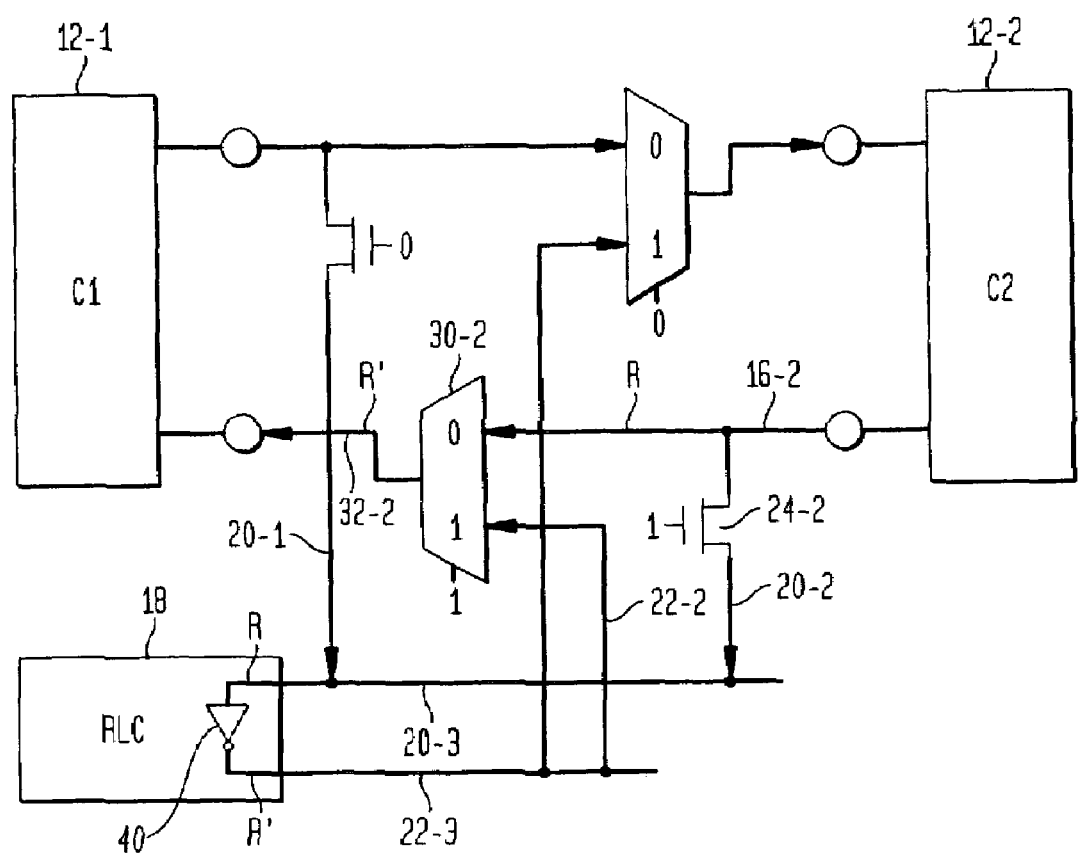
FIG. 3 is a diagrammatic view in accordance with the present invention of a reconfigurable system-on-chip with a reconfigurable logic core having an inverter.

In FIG. 3, the RLC 18 contains an inverter 40 for inverting a signal R, that originates from the core 12-2 on the first signal line 16-2, to a replacement signal R' for a situation in which a programmer, for example, realized that the core 12-1 needed the inverse signal of R (which is R') and not the original signal R.

The switch 24-2 switches the signal R to the input signal line 20-2, 20-3 of the RLC by having the observation configuration memory bit for the switch set as a logic 1. Once in the RLC 18, the programmer has the signal R inverted by the inverter 40 to a signal R'. The output signal line 22-3, 22-2 of the RLC conveys the signal R' to the multiplexer 30-2. The multiplexer 30-2, since its control configuration memory bits comprises a logic 1, conveys the signal R' on a signal line output 32-2 thereof to the core 12-1 (C1).

Those skilled in the art should appreciate that this invention makes such replacement signal conveyance possible because the programmer could observe the signal and determine they needed a replacement, an inverted signal in this instance. In the past, if such realization happened in the context of an ASIC, for example, the entire ASIC design would require a reworking.

As shown, the input and output signal lines of the RLC act as the respective inputs and outputs of the inverter 40. A programmer can accomplish such input/output arrangement in the RLC by simple modification to the configuration random access memory (RAM) (not shown, but located in the RLC) that, in turn, controls the programmable interconnect of such devices like the inverter.

While the foregoing signal inversion may introduce a time delay into the reception of the inverted signal R' at the core 12-1, if such delay acts to prejudice the device, an appropriate adjustment to the clocking speed of the reconfigurable system-on-chip can be implemented.

Figure 4:
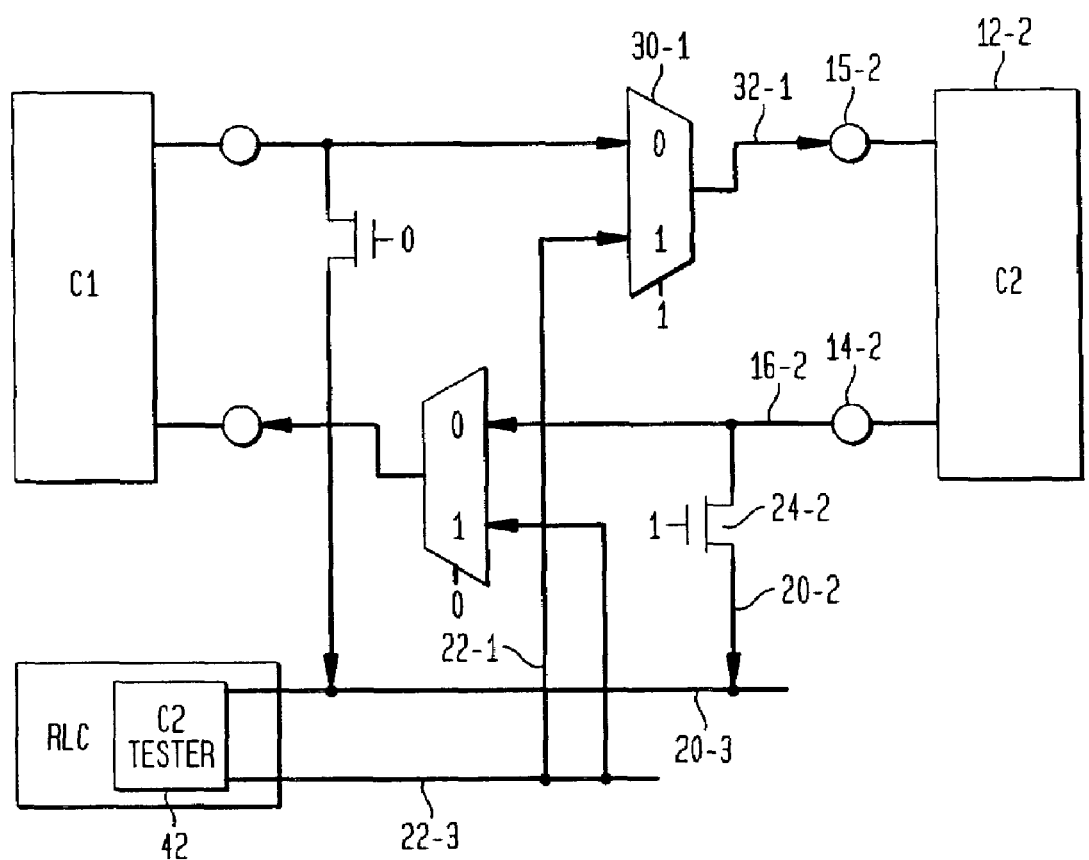
FIG. 4 is a diagrammatic view in accordance with the present invention of a reconfigurable system-on-chip with a reconfigurable logic core having a test circuit.

With reference to FIG. 4, the RLC 18 contains a test circuit 42 for testing a signal originating from one of the cores. In this instance, the signal originates from core C2. The C2 Tester (test circuit 42) tests the signal for some desired property after the signal gets switched from the first signal line 16-2 to the RLC. As before, a user accomplishes switching by setting the observation configuration memory bit (the input to the switch 24-2) to logic 1.

Since the signal from the core C2 relates to testing, it is appropriate to send the signal or a replacement signal back to the same core C2. Thus, the multiplexer 30-1 that provides an input to the core C2 at node 15-2, becomes controlled to convey the signal on the output signal line 22-3, 22-1 of the RLC to core C2 along a signal line output 32-1 of the multiplexer 30-1. As before, the control configuration memory bit, when a logic 1, acts to control conveyance of signals through the multiplexer 30-1.

In this embodiment, the input and output signal line of the RLC act as the respective inputs and outputs of the test circuit 42. A programmer can accomplish such input/output arrangement in the RLC in the programming-interconnect manner previously described for the inverter 40. As a result, this implementation allows use of the device 40 or 42 in the RLC on an as-needed basis vice a hard-wiring of the device.

Conventional systems-on-chip, in contrast, while possessing test circuits for testing the system post manufacturing, rarely, if ever, use the test circuit again because of a lack of a convenient ability to access the test circuit. Thus, prior art systems-on-chip still contain test circuits and suffer a silicon real-estate penalty for containing an unused device/circuit. In this invention, the interconnect from the test circuit can be removed after completion of the test so that no silicon real estate penalty gets imposed.

Regarding testing, this invention also contemplates the ability of a human programmer, for example, to examine and test signals in accordance with IEEE standards, or proposed standards, 1149.1, P1500 or other.

Figure 5:
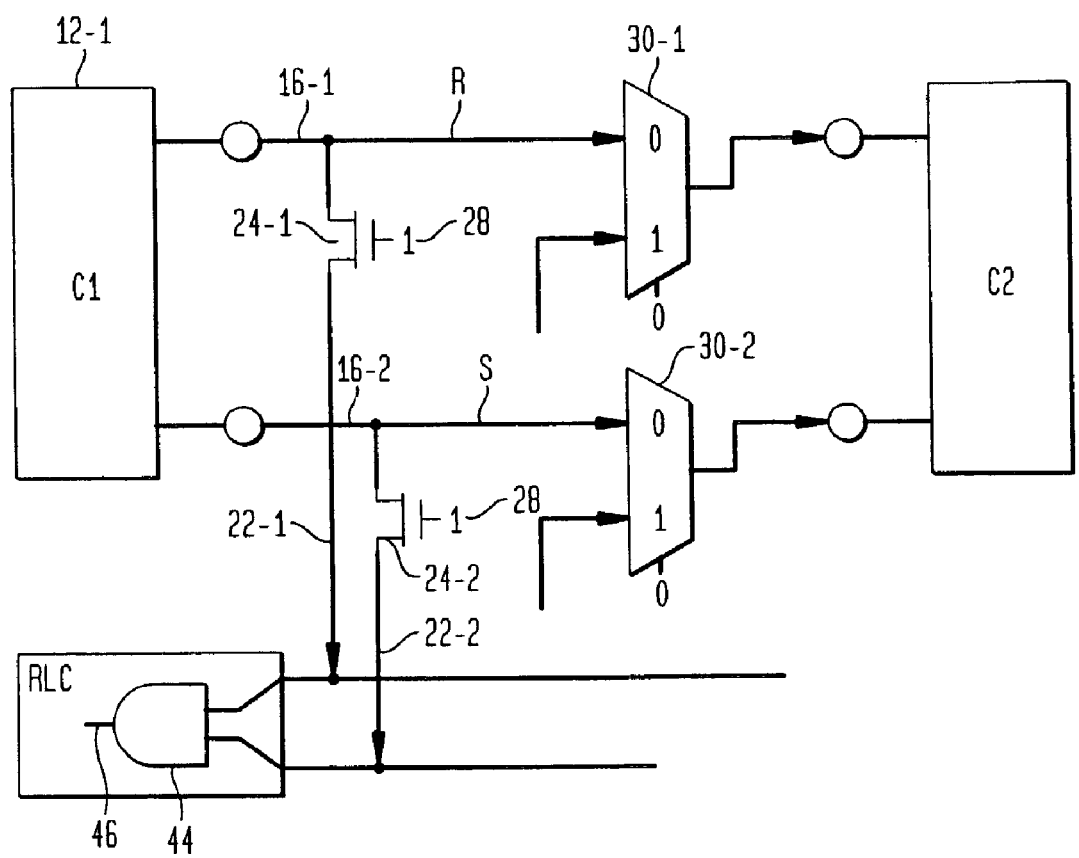
FIG. 5 is a diagrammatic view in accordance with the present invention of a reconfigurable system-on-chip with a reconfigurable logic core having a representative logic gate.

In still another embodiment of the invention, and with reference to FIG. 5, the RLC 18 contains a logic gate 44 in the form of an AND gate. The AND gate has inputs thereto comprised of the input signal lines 22-1, 22-2. The respective signal on these lines, R and S, originate from core C1 and switch from the first signal lines 16-1, 16-2 to the input signal lines upon activation of switches 24-1, 24-2 when the observation configuration memory bits 28 comprise logic 1's.

As a result, a programmer can use the output 46 of the logic gate 44 to monitor a condition where R.S=1, for example. Thereafter, an appropriate course of action may include stopping of the system clock, single-stepping the system operation and partial or complete state dumps as those terms are well understood by those skilled in the art.

As should be apparent from the figure, the control configuration memory bits for selectively controlling the multiplexers 30-1, 30-2 comprise logic 0 values and, therefore, no signals from the RLC get conveyed through the multiplexers back to either of the cores.

While this invention has taught specific devices within the RLC, still other devices and applications are contemplated beyond those already described and include a logic analyzer, any variety of logic gates, amplifiers, or other similar devices. Thus, depending upon need, the programmer can configure various programmably interconnected devices within the RLC and achieve system-on-chip solutions that have been heretofore difficult, if not impossible, to implement. In this manner, the reconfigurable system-on-chip contains more robustness than conventional devices and allows for cost-effective troubleshooting, signal inversion, signal monitoring or other.

The foregoing description of preferred embodiments of the present invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

The invention claimed is:

1. A reconfigurable system-on-chip, comprising:
   a first core having an output line;
   a reconfigurable logic core (RLC) having an input line and an output line, with the output line of the first core being electrically coupled, via a first switch, to the input line of the RLC;
   a first multiplexer having first and second inputs and an output, wherein:
      the output line of the first core is electrically coupled to the first input of the first multiplexer; and
      the output line of the RLC is electrically coupled to the second input of the first multiplexer;
   a second core having an input line electrically coupled to the output of the first multiplexer;
   a second multiplexer having first and second inputs and an output, wherein:
      the first core has an input line that is electrically coupled to the output of the second multiplexer;
      the second core has an output line that is electrically coupled to (i) the input line of the RLC via a second switch and (ii) the first input of the second multiplexer; and
      the output line of the RLC is electrically coupled to the second input of the second multiplexer; and
   a configuration memory that controls (i) the first multiplexer to selectively couple the input line of the second core to one of the output line of the first core and the output line of the RLC and (ii) the second multiplexer to selectively couple the input line of the first core to one of the output line of the second core and the output line of the RLC.

2. The system-on-chip of claim 1, wherein the configuration memory controls the first switch.

3. The system-on-chip of claim 1, wherein the configuration memory controls the first and second switches.

4. The system-on-chip of claim 1, wherein the first switch, the RLC, and the second multiplexer are configurable to return a signal that is received by the RLC via the output line of the first core back to the first core via the input line of the first core.

5. The system-on-chip of claim 1, wherein the RLC enables observation of a signal that appears on the output line of the first core.

6. The system-on-chip of claim 1, wherein the RLC modifies a signal received via the output line of the first core to produce a modified signal, which is conveyed to the second core via the output line of the RLC.

7. The system-on-chip of claim 6, wherein the RLC comprises one or more of a logic gate, an inverter, and a test circuit for producing the modified signal.

8. The system-on-chip of claim 1, wherein the first and second cores are part of a plurality of cores having between four and ten cores, each electrically coupled to the input line of the RLC via a corresponding switch.

9. A method of signal processing in a reconfigurable system-on-chip, the method comprising:
   applying a signal produced by a first core to an output line of the first core, wherein the reconfigurable system-on-chip comprises:
      the first core;
      a reconfigurable logic core (RLC) having an input line and an output line, with the output line of the first core being electrically coupled, via a first switch, to the input line of the RLC;
      a first multiplexer having first and second inputs and an output, wherein:
         the output line of the first core is electrically coupled to the first input of the first multiplexer; and
         the output line of the RLC is electrically coupled to the second input of the first multiplexer;
      a second core having an input line electrically coupled to the output of the first multiplexer; and
      a configuration memory that controls the first multiplexer;
   selectively coupling the input line of the second core to one of the output line of the first core and the output line of the RLC based on a first configuration bit stored in the configuration memory, wherein the system-on-chip further comprises a second multiplexer having first and second inputs and an output, wherein:
      the first core has an input line that is electrically coupled to the output of the second multiplexer;
      the second core has an output line that is electrically coupled to (i) the input line of the RLC via a second switch and (ii) the first input of the second multiplexer; and
      the output line of the RLC is electrically coupled to the second input of the second multiplexer; and
   selectively coupling the input line of the first core to one of the output line of the second core and the output line of the RLC based on a second configuration bit stored in the configuration memory.

10. The method of claim 9, further comprising turning the first switch ON or OFF based on a second configuration bit stored in the configuration memory.

11. The method of claim 9, further comprising:
   turning the first switch ON or OFF based a third configuration bit stored in the configuration memory; and
   turning the second switch ON or OFF based a fourth configuration bit stored in the configuration memory.

12. The method of claim 9, further comprising configuring the first switch, the RLC, and the second multiplexer to return the signal back to the first core via the input line of the first core.

13. The method of claim 9, further comprising:
   modifying the signal in the RLC to produce a modified signal; and
   conveying the modified signal to the second core via the output line of the RLC.

14. The method of claim 13, wherein the step of modifying the signal in the RLC comprises applying the signal to one or more of a logic gate, an inverter, and a test circuit.

* * * * *

UNITED STATES PATENT AND TRADEMARK OFFICE
CERTIFICATE OF CORRECTION

| | | |
|---|---|---|
| PATENT NO. | : 7,650,545 B1 | Page 1 of 1 |
| APPLICATION NO. | : 10/379043 | |
| DATED | : January 19, 2010 | |
| INVENTOR(S) | : Abramovici et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 2060 days.

Signed and Sealed this

Twenty-eighth Day of December, 2010

David J. Kappos
*Director of the United States Patent and Trademark Office*